US012772472B2

(12) United States Patent
Baburske et al.

(10) Patent No.: US 12,772,472 B2
(45) Date of Patent: Oct. 20, 2026

(54) DUAL GATE POWER SEMICONDUCTOR DEVICE AND METHOD OF CONTROLLING A DUAL GATE POWER SEMICONDUCTOR DEVICE

(71) Applicant: Infineon Technologies AG, Neubiberg (DE)

(72) Inventors: Roman Baburske, Otterfing (DE); Frank Pfirsch, Munich (DE); Jana Hänsel, Dresden (DE); Katja Waschneck, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 874 days.

(21) Appl. No.: 18/122,918

(22) Filed: Mar. 17, 2023

(65) Prior Publication Data

US 2023/0307531 A1 Sep. 28, 2023

(30) Foreign Application Priority Data

Mar. 24, 2022 (DE) ......................... 102022107009.3

(51) Int. Cl.
*H10D 12/00* (2025.01)
*H03K 17/567* (2006.01)
*H10D 62/17* (2025.01)

(52) U.S. Cl.
CPC ......... *H10D 12/481* (2025.01); *H03K 17/567* (2013.01); *H10D 62/393* (2025.01)

(58) Field of Classification Search
CPC ... H10D 12/481; H10D 62/393; H03K 17/567
(Continued)

(56) References Cited

U.S. PATENT DOCUMENTS 10,141,404 B2 11/2018 Mauder et al.
11,171,202 B2 * 11/2021 Mauder ................ H10D 12/481
(Continued)

FOREIGN PATENT DOCUMENTS

DE 102008051259 A1 5/2009
DE 102014117364 A1 5/2015
DE 102014119543 A1 6/2016

OTHER PUBLICATIONS

Mori, Mutsuhiro, et al., "An Innovative Silicon Power Device (i-Si) through Time and Space Control of a Stored Carrier (TASC)", Proceedings of the 30th International Symposium on Power Semiconductor Devices & ICs, Chicago, USA, May 13-17, 2018, pp. 520-523.

*Primary Examiner* — Igwe U Anya
(74) *Attorney, Agent, or Firm* — Murphy, Bilak & Homiller, PLLC

(57) ABSTRACT

A power semiconductor device includes: a semiconductor body coupled to first and second load terminals; an active region with first and second sections, both configured to conduct a load current between the load terminals; electrically isolated from the load terminals, first control electrodes in the first section and second control electrodes in both the first and second sections); and semiconductor channel structures in the semiconductor body extending in both the first and second sections. Each channel structure is associated to at least one of the first and second control electrodes. The respective control electrode is configured to induce an inversion channel for load current conduction in the associated semiconductor channel structure. The first section exhibits a first effective total inversion channel width per unit area ratio, $W/A_1$, and the second section exhibits a second effective inversion channel width per unit area ratio, $W/A_2$, where $W/A_1 > W/A_2$.

16 Claims, 9 Drawing Sheets

(58) Field of Classification Search
USPC .......................................................... 257/341
See application file for complete search history.

(56) References Cited

U.S. PATENT DOCUMENTS

| | | | | |
|---|---|---|---|---|
| 2016/0190123 | A1* | 6/2016 | Laven | H10D 12/481 257/140 |
| 2016/0336132 | A1 | 11/2016 | Fulcheri | |
| 2018/0019319 | A1 | 1/2018 | Baburske et al. | |
| 2018/0308757 | A1 | 10/2018 | Kakimoto | |
| 2018/0342605 | A1* | 11/2018 | Dainese | H10D 12/038 |
| 2019/0165160 | A1 | 5/2019 | Hutzler et al. | |
| 2019/0296134 | A1 | 9/2019 | Matsudai et al. | |
| 2020/0052077 | A1 | 2/2020 | Altstaetter et al. | |
| 2020/0287044 | A1 | 9/2020 | Hikasa | |
| 2021/0134791 | A1 | 5/2021 | Gejo et al. | |
| 2021/0210525 | A1 | 7/2021 | Jeong et al. | |
| 2021/0296479 | A1* | 9/2021 | Pfirsch | G06F 30/398 |
| 2022/0052190 | A1 | 2/2022 | Arnold et al. | |
| 2022/0059682 | A1 | 2/2022 | Baburske | |
| 2022/0093585 | A1 | 3/2022 | Baburske | |

* cited by examiner (D)

(E)

(F)

DUAL GATE POWER SEMICONDUCTOR DEVICE AND METHOD OF CONTROLLING A DUAL GATE POWER SEMICONDUCTOR DEVICE

TECHNICAL FIELD

This specification refers to embodiments of a power semiconductor device and to embodiments of a method of producing a power semiconductor device. In particular, this specification refers to a power semiconductor device having an IGBT configuration and being controllable with two independent control signals associated with differently configured IGBT areas, and to embodiments of a corresponding control method.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate electrode. For example, upon receiving a corresponding control signal from, e.g., a driver unit, the control electrode may set the power semiconductor device in one of a forward conducting state and a blocking state.

The load current is typically conducted by means of an active region of the power semiconductor device. The active region is typically surrounded by an edge termination region, which is terminated by an edge of the chip.

To achieve a certain switching behavior and/or certain charge carrier distributions in the semiconductor, e.g., related to optimizing switching energies and/or saturation voltages, second control electrodes based on which the device can be controlled in addition to first control electrodes may be provided. Such devices are typically referred to dual-gate transistors or, respectively, multi-gate transistors.

SUMMARY

According to an embodiment, a power semiconductor device exhibits comprises the following: a semiconductor body coupled to a first load terminal and a second load terminal; an active region with a first section and a second section, both configured to conduct a load current between the first load terminal and the second load terminal; electrically isolated from the first load terminal and the second load terminal, a plurality of first control electrodes in the first section and a plurality of second control electrodes in both the first section and the second section, wherein the first control electrodes are insulated from the second control electrodes; and a plurality of semiconductor channel structures in the semiconductor body extending in both the first section and the second section, each of the plurality of channel structures being associated to at least one of the first and second control electrodes, wherein the respective at least one of the first and second control electrodes is configured to induce an inversion channel for load current conduction in the associated semiconductor channel structure. The first section exhibits a first effective total inversion channel width per unit area ratio, $W/A_1$ and the second section exhibits a second effective total inversion channel width per unit area ratio, $W/A_2$, wherein $W/A_1$ is greater than $W/A_2$.

For example, $W/A_1$ amounts to at least 150% of $W/A_2$ or at least 190% of $W/A_2$, or at least 230% of $W/A_2$.

According to an embodiment, a power semiconductor device comprises the following: a semiconductor body coupled to a first load terminal and a second load terminal; an active region with a first section and a second section, both configured to conduct a load current between the first load terminal and the second load terminal; electrically isolated from the first load terminal and the second load terminal, a plurality of first control electrodes in the first section and a plurality of second control electrodes in both the first section and the second section, wherein the first control electrodes are insulated from the second control electrodes; and a plurality of semiconductor channel structures in the semiconductor body extending in both the first section and the second section, each of the plurality of channel structures being associated to at least one of the first and second control electrodes, wherein the respective at least one of the first and second control electrodes is configured to induce an inversion channel for load current conduction in the associated semiconductor channel structure. The first section exhibits a first effective inversion channel width per unit area ratio of inversion channels induced by the first control electrodes, $W/A_{G11}$, and the second section exhibits a second effective inversion channel width per unit area ratio of inversion channels induced by the first control electrodes, $W/A_{G12}$, wherein $W/A_{G11}$ is greater than $W/A_{G12}$.

For example, the effective inversion channel width induced by only the first control electrodes may be greater in the first section. For example, $W/A_{G12}$ may be smaller than 40% of $W/A_{G11}$, or smaller than 25% of $W/A_{G11}$, or $W/A_{G12}$ may be 0. For example, $W/A_{G11}$ may be greater than 120% of $W/A_{G12}$, or greater than 200% of $W/A_{G12}$.

When $W/A_{G12}$ is 0, no inversion channel is induced by first control electrodes in the second section. In some embodiments, no first control electrodes a present in the second section. Alternatively, in mesas next to first control electrodes in the second section a lacking the source area.

For example, 80% to 100% of the control electrodes in the second section are second control electrodes.

For example, each of the channel structures comprises a section of a semiconductor source region electrically connected to the first load terminal, and wherein the difference between $W/A_1$ and $W/A_2$ is achieved at least based on a corresponding lateral structure of the source region.

According to a further embodiment, a power semiconductor device comprises the following: a semiconductor body coupled to a first load terminal and a second load terminal; an active region with a first section and a second section, both configured to conduct a load current between the first load terminal and the second load terminal; electrically isolated from the first load terminal and the second load terminal, a plurality of first control electrodes in the first section and a plurality of second control electrodes in both the first section and the second section, wherein the first control electrodes are insulated from the second control electrodes; a plurality of semiconductor channel structures in the semiconductor body extending in both the first section and the second section, each of the plurality of channel structures being associated to at least one of the first and second control electrodes, wherein the respective at least one of the first and second control electrodes is configured to induce an inversion channel for load current conduction in the associated semiconductor channel structure, wherein 80% to 100% of the control electrodes in the second section are second control electrodes; a driver unit, e.g. a gate driver, configured to control a switching process by subjecting the first control electrodes to a first control signal and subjecting the second control electrodes to a second control signal. The first control signal is provided with a time delay with respect to the second control signal.

For example, the first section exhibits a first effective total inversion channel width per unit area ratio, $W/A_1$, and the second section exhibits a second effective inversion channel width per unit area ratio, $W/A_2$, wherein $W/A_1$ is greater than $W/A_2$.

For example, the number of control electrodes per unit area in the first section, $G/A_1$, is at least 20%, at least 50%, or at least 80% greater than the number of control electrodes per unit area in the second section, $G/A_2$.

For example, the first control electrodes are electrically isolated from the second control electrodes.

For example, the total area of the second section amounts to at least 15%, at least 35%, or at least 45% of the total area of the active region.

For example, the total area of the first section amounts to at least 25%, at least 35%, or at least 51% of the remaining total area of the active region not occupied by the second section. These numbers may apply, for example, for a RC-IGBT with an additional diode area. In case of an IGBT without diode area, the total area of the first section may amount to at least 65%, at least 75%, or at least 85% of the remaining total area of the active region not occupied by the second section.

For example, the second section surrounds the first section.

For example, the second section is surrounded by an edge termination region, and wherein the effective inversion channel width per unit area ratio, $W/A_2$, of the second section increases by at least 10%, by at least 20%, or by at least 40% in a direction towards the edge termination region.

For example, the power semiconductor devices further comprises, in the semiconductor body and electrically connected to the second load terminal, an emitter region, the emitter region extending in both the first section and the second section, wherein an average active dopant concentration of the emitter region part extending into the second section is at least 30%, at least 100%, or at least 200% greater than an active average dopant concentration of the emitter region part extending into the first section.

For example, the first control electrodes are arranged in first control trenches and insulated from the semiconductor body by a first trench insulator; the second control electrodes are arranged in second control trenches and insulated from the semiconductor body by a second trench insulator; and the semiconductor channel structures are arranged in mesas of the semiconductor body, the mesas being laterally confined at least by the control trenches on at least one side.

For example, the power semiconductor device further comprises a plurality of source trenches in both the first section and the second section, each source trench comprising a source electrode electrically connected to the first load terminal.

For example, an average number of source trenches arranged between adjacent semiconductor channel structures in the first section is smaller than an average number of source trenches arranged between adjacent semiconductor channel structures in the second section.

For example, an average number of source trenches arranged between adjacent control trenches in the first section is smaller than an average number of source trenches arranged between adjacent control trenches in the second section (e.g., smaller by one source trench, smaller by two source trenches or smaller by four source trenches).

For example, in the first section, along distance between a semiconductor channel structure controlled by one of the first control electrodes and an adjacent semiconductor channel structure controlled by one of the second control electrodes, there is arranged one or none of the source trenches.

For example, the semiconductor body is formed in a single semiconductor chip.

For example, said time delay regarding a turn-on operation amounts to at least 100 ns, e.g. 1 μs, e.g. 2 μs, e.g., to ensure a short-circuit detection within this time frame. For example, the time delay regarding a turn-off operation amounts to at least 1 μs, e.g. at least 1 μs, e.g., for a 650 V device, at least 2 μs for a 1200 V device, at least 30 μs for a 6500 V device.

According to a further embodiment, a method of controlling a power semiconductor device is presented. Said power semiconductor device comprises: a semiconductor body coupled to a first load terminal and a second load terminal; an active region with a first section and a second section, both configured to conduct a load current between the first load terminal and the second load terminal; electrically isolated from the first load terminal and the second load terminal, a plurality of first control electrodes in the first section and a plurality of second control electrodes in both the first section and the second section; a plurality of semiconductor channel structures in the semiconductor body extending in both the first section and the second section, each of the plurality of channel structures being associated to at least one of the first and second control electrodes, wherein the respective at least one of the first and second control electrodes is configured to induce an inversion channel for load current conduction in the associated semiconductor channel structure, wherein 80% to 100% of the control electrodes in the second section are second control electrodes. The method comprises controlling a switching process by subjecting the first control electrodes to a first control signal and subjecting the second control electrodes to a second control signal, wherein the first control signal is provided with a time delay with respect to the second control signal.

It should be noted, that all definitions of the width of any inversion channel is related to a forward conducting on-state of the device. The definitions of the width of the respective inversion may apply, for example, to a forward conduction trough the semiconductor device in an on-state of the semiconductor device with a nominal load current and with the nominal on-voltage applied to all gates (e.g. 15V to both gates).

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings.

DETAILED DESCRIPTION

Figure 1:
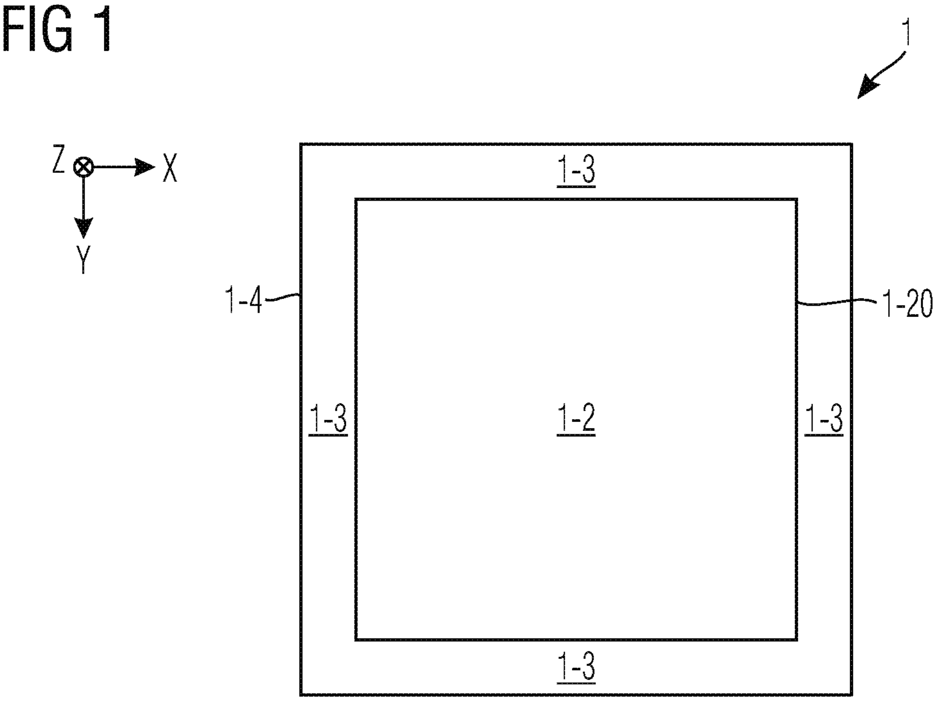
FIG. 1 schematically and exemplarily illustrates a section of a horizontal projection of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device, wherein "low ohmic" may mean that the characteristics of the respective contact are essentially not influenced by the ohmic resistance. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled and/or electrostatically coupled (for example, in case of a junction). To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor unit cells, such as a monolithically integrated diode cell, a derivative of a monolithically integrated diode cell (e.g., a monolithically integrated cell of two anti-serially connected diodes), a monolithically integrated transistor cell, e.g., a monolithically integrated MOSFET or IGBT cell and/or derivatives thereof. Such diode/transistor cells may be integrated in a power semiconductor module. A plurality of such cells may constitute a cell field that is arranged with an active region of the power semiconductor device.

The term "blocking state" of the power semiconductor device may refer to conditions, when the semiconductor device is in a state configured for blocking a current flow through the semiconductor device, while an external voltage is applied. More particularly, the semiconductor device may be configured for blocking a forward current through the semiconductor device while a forward voltage bias is applied. In comparison, the semiconductor may be configured for conducting a forward current in a "conducting state" or "on-state" of the semiconductor device, when a forward voltage bias is applied. A transition between the blocking state and the conducting state may be controlled by a control electrode or, more particularly, a potential of the control electrode.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 200 V, more typically 500 V and above, e.g., up to at least 3500 V or even more, e.g., up to at least 7 kV, or even up to 10 kV or more, depending on the respective application.

For example, the term "power semiconductor device" as used in this specification is not directed to logic semiconductor devices that are used for, e.g., storing data, computing data and/or other types of semiconductor-based data processing.

The present specification in particular relates to a power semiconductor device embodied as a MOSFET, as an IGBT or as an RC-IGBT, i.e., a bipolar power semiconductor transistor or a derivate thereof. Each of the power semiconductor devices described herein may exhibit an IGBT-configuration, or a MOSFET-configuration, or an RC-IGBT-configuration.

For example, the power semiconductor device described below may be implemented on a single semiconductor chip, e.g., exhibiting a stripe cell configuration (or a cellular/needle cell configuration) and can be configured to be employed as a power component in a low-, medium- and/or high voltage application.

Figure 9:
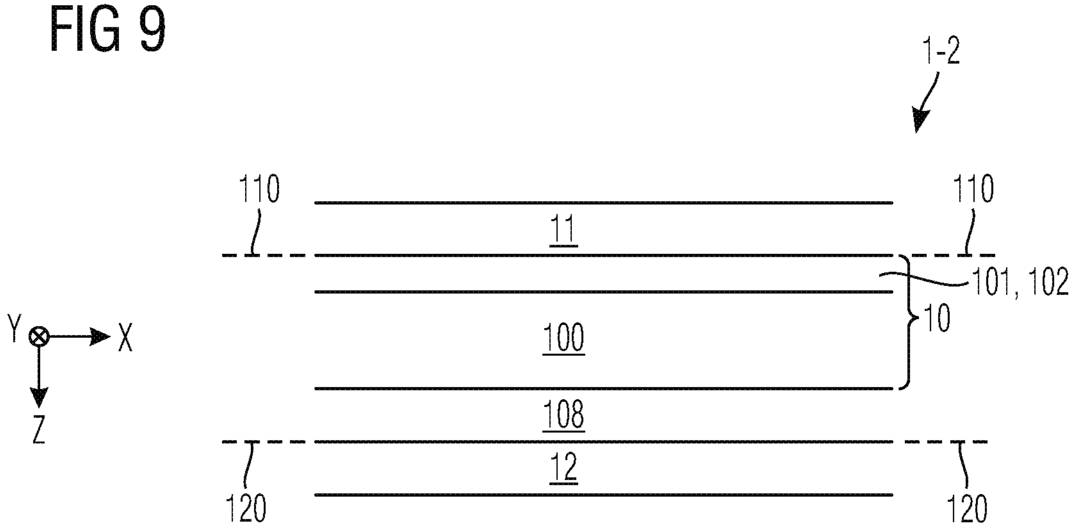
FIG. 9 schematically and exemplarily illustrates a section of a vertical cross-section of a power semiconductor device in accordance with one or more embodiments.

FIG. 1 illustrates a section of a horizontal projection of a power semiconductor device 1 in accordance with one or more embodiments. FIG. 9 illustrates a corresponding section of a (simplified) vertical cross-section. The power semiconductor device 1 exhibits an IGBT-configuration and comprises a semiconductor body 10 coupled to a first load terminal 11 and a second load terminal 12. An active region 1-2 of the power semiconductor device 1 has a first section 1-21 and a second section 1-22, both sections 1-21 and 1-22 being configured to conduct a load current between the first load terminal 11 and the second load terminal 12.

As illustrated, the semiconductor body 10 may be sandwiched between the first load terminal 11 and the second load terminal 12. Hence, the power semiconductor device 1 may exhibit a vertical configuration, according to which the load current, in both sections 1-21 and 1-22 follows a path substantially in parallel to the vertical direction Z.

The active region 1-2 that includes both sections 1-21 and 1-22 may be confined by a border 1-20 where the active region 1-2 transitions into the edge termination region 1-3, which is in turn terminated by the chip edge 1-4.

Herein, the terms active region and edge termination region are used in a technical context the skilled person typically associates with these terms. Accordingly, the active region's purpose is primarily to ensure load current conduction, whereas the edge termination region 1-3 is configured to reliably terminate the active region 1-2, e.g. in terms of courses of the electric field during conduction state and during blocking state.

Figure 3:
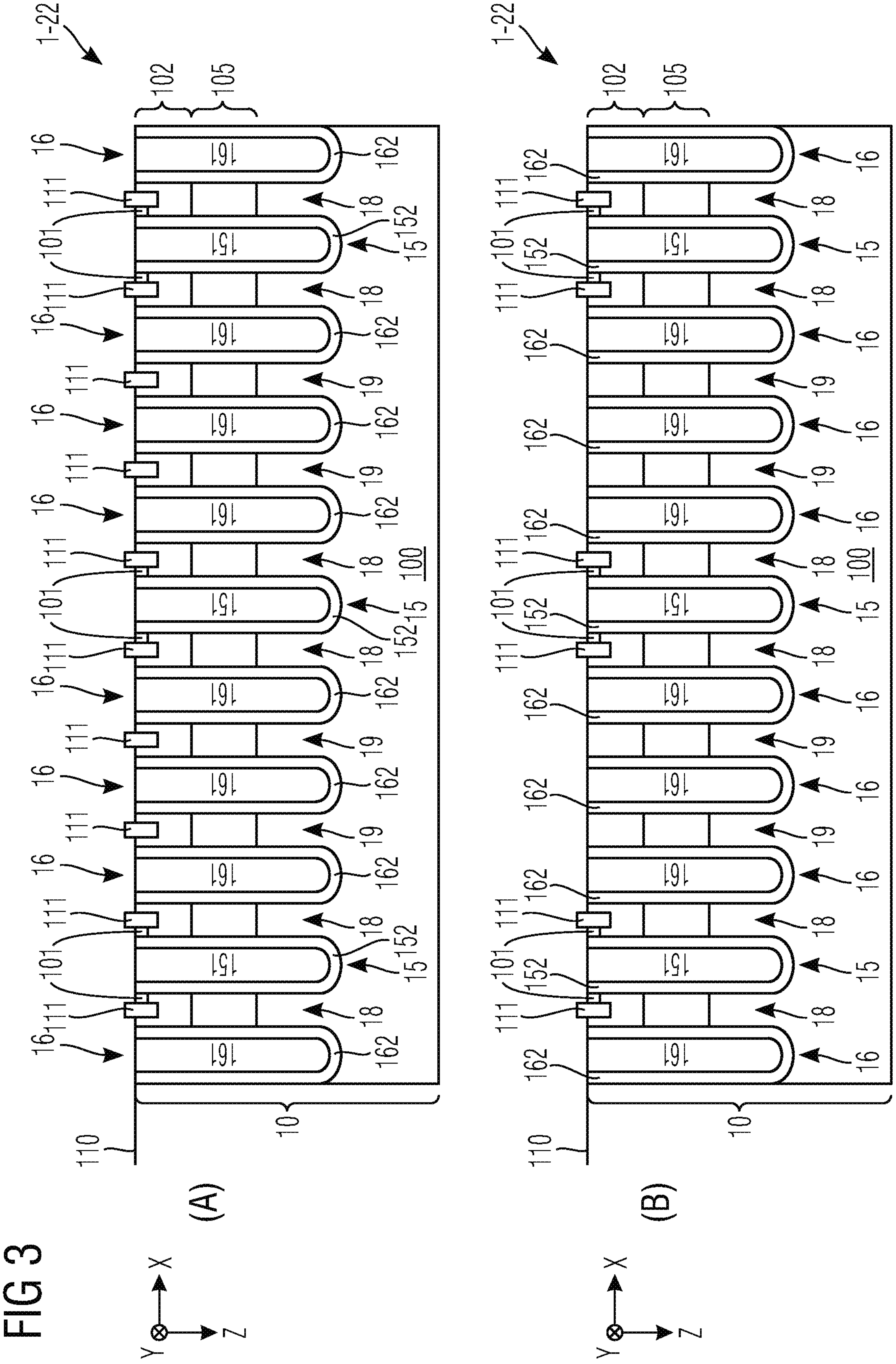
Figure 4:
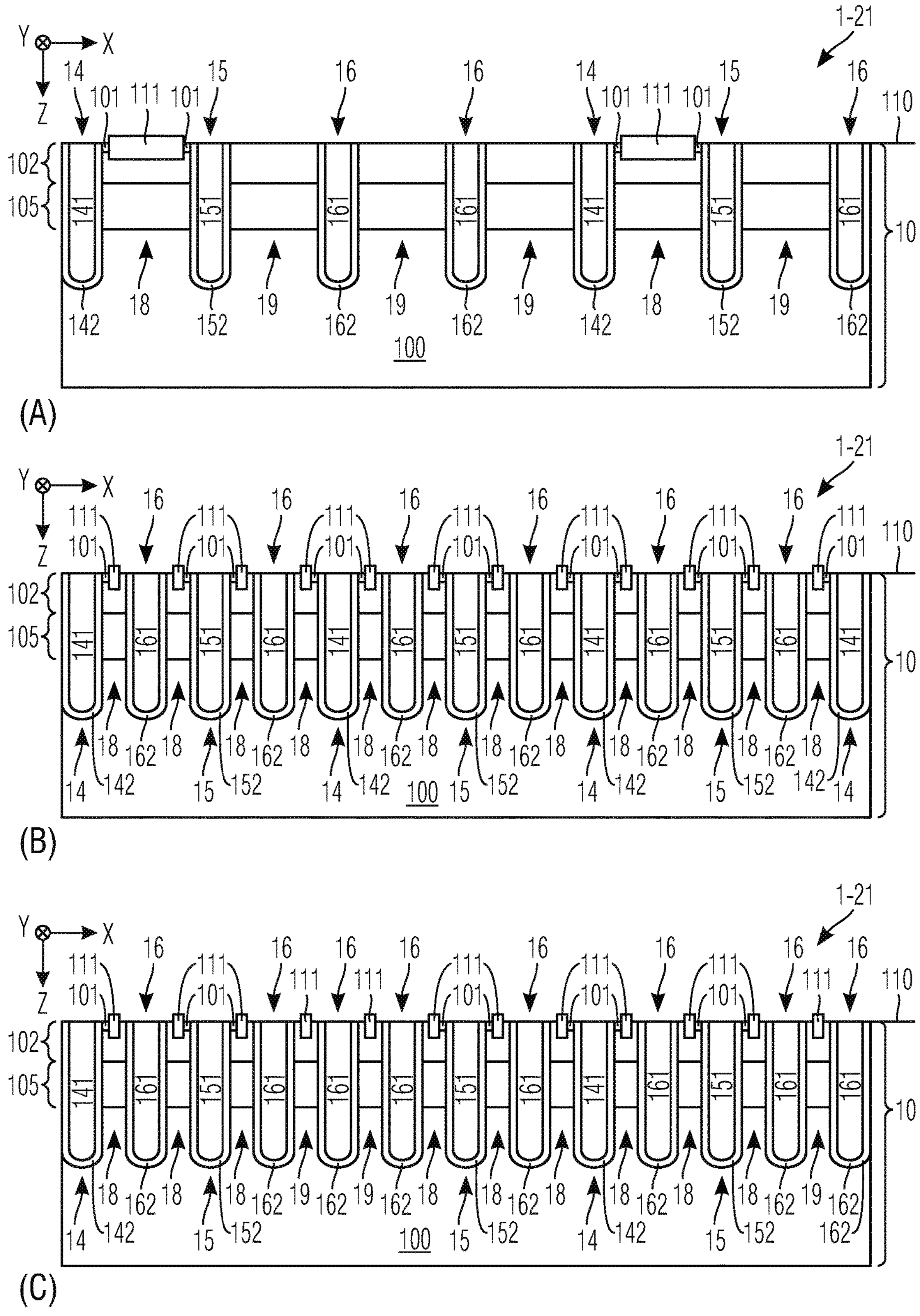
FIG. 4 schematically and exemplarily illustrates a respective first section of a vertical cross-section of an active region of power semiconductor devices in accordance with at least five embodiments.
Figure 4:
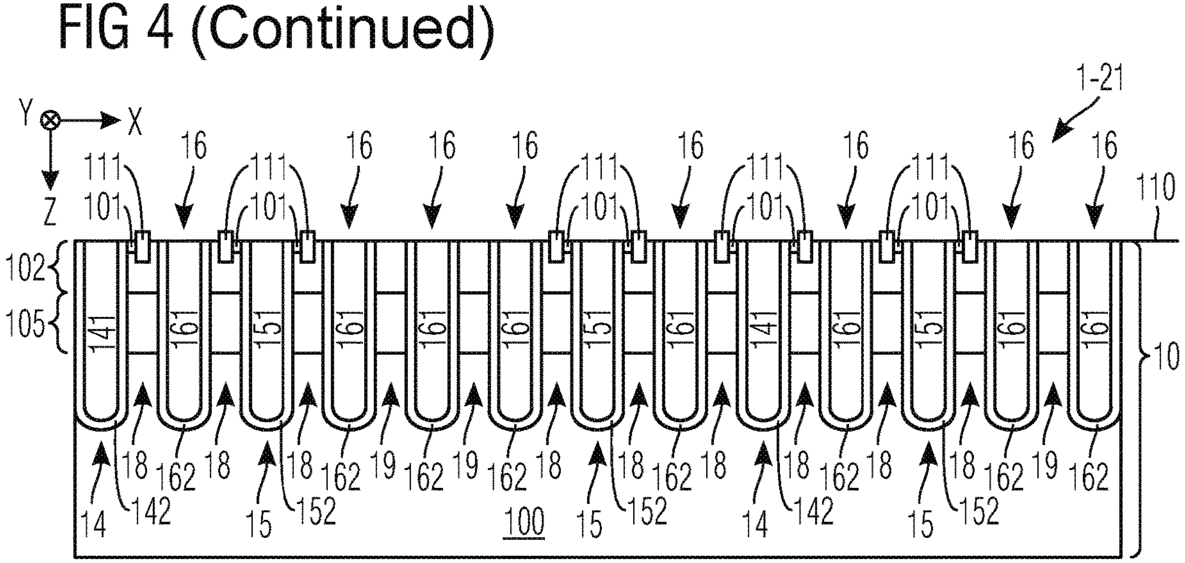
Figure 4:
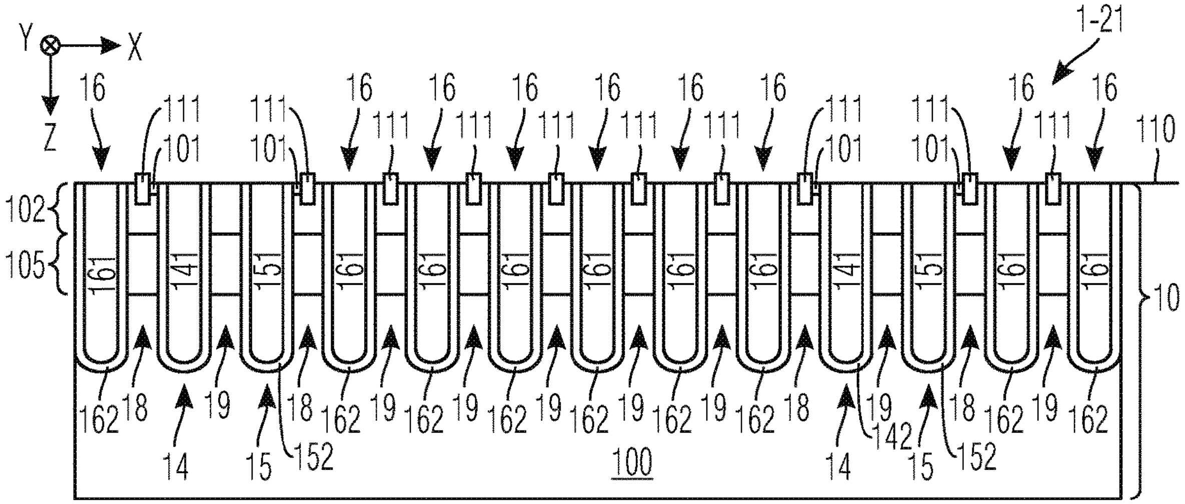

Referring additionally to FIGS. 3 and 4, the power semiconductor device 1 further comprises, electrically isolated from the first load terminal 11 and the second load terminal 12, a plurality of first control electrodes 141 in the first section 1-21 (cf. FIG. 4) and a plurality of second control electrodes 151 in both the first section 1-21 and the second section 1-22 (cf. FIG. 3).

In the context of power semiconductor devices having an IGBT configuration, these control electrodes are typically referred to as gate electrodes. The control signal may be generated by applying a voltage, e.g. between the first load terminal 11 and a control/gate terminal (not illustrated).

For example, each of the plurality of the first control electrodes 141 is electrically connected to at least one first control terminal, and each of the plurality of second control electrodes 151 is electrically connected to at least one second control terminal, wherein each of the at least one first control terminal is electrically isolated from each of the at least one second control terminal. Thereby, the first control electrodes 141 may be subjected to a first control voltage independently from the second control electrodes 151, which may be subjected to a second control voltage. For example, the first control voltage is generated as a voltage between the first control electrodes 141 (or, respectively, the first control terminal(s)) and the first load terminal 11, and the second control voltage is generated as a voltage between the second control electrodes 151 (or, respectively, the second control terminal (s)) and the first load terminal 11. The first control voltage may be different from the second control voltage.

The power semiconductor device 1 further comprises a plurality of semiconductor channel structures in the semiconductor body 10 that extend in both the first section 1-21 and the second section 1-22. Each of the plurality of channel structures is associated to at least one of the first and second control electrodes 141, 151, wherein the respective at least one of the first and second control electrodes 141, 151 is configured to induce an inversion channel for load current conduction in the associated semiconductor channel structure. Each channel structure may comprise a source region 101 of the first conductivity type and a body region 102 of the second conductivity type, both electrically connected to the first load terminal 11, wherein the body region 102 isolates the source region 101 from a drift region 100 of the power semiconductor device 1, as will be explained in more detail with respect to FIGS. 3 and 4 below. Said inversion channel in the respective associated channel structure may be induced by subjecting the respective first control electrode 141 to the first control voltage or, respectively, by subjecting the respective second control electrode 151 to the second control voltage.

In an embodiment, the first section 1-21 exhibits a first effective total inversion channel width per unit area ratio, $W/A_1$, and the second section 1-22 exhibits a second effective inversion channel width per unit area ratio, $W/A_2$, wherein $W/A_1$ is greater than $W/A_2$. For example, $W/A_1$ amounts to at least $1.5*W/A_2$. Further, 80% to 100% of the control electrodes 141, 151 in the second section 1-22 can be second control electrodes 151. In an embodiment, each of the channel structures comprises a section of said semiconductor source region 101 electrically connected to the first load terminal 11, wherein the difference between $W/A_1$ and $W/A_2$ is achieved at least based on a corresponding lateral structure of the source region 101. The features described in this paragraph will be explained in more detail below.

In another embodiment, 80% to 100% of the control electrodes 141, 151 in the second section 1-22 are second control electrodes 151, and the power semiconductor device 1 comprises a (non-illustrated) a driver unit, e.g. a gate driver, configured to control a switching process by subjecting the first control electrodes 141 to a first control signal G1 and subjecting the second control electrodes 151 to a second control signal G2 (cf. FIG. 9). The first control signal G1 may comprise or be said first control voltage, and the second control signal G2 may comprise or be said second control voltage. In an embodiment, the first control signal G1 is provided with a time delay with respect to the second control signal G2. Also in this embodiment, it may be provided that the first section 1-21 exhibits a first effective total inversion channel width per unit area ratio, $W/A_1$ and the second section 1-22 exhibits a second effective inversion channel width per unit area ratio, $W/A_2$, wherein $W/A_1$ is greater than W/A2. Also the features described in this paragraph will be explained in more detail below.

The above described embodiments include the following recognitions: the active region 1-2 of the power semiconductor device 1 may be divided into one or more first sections 1-21 and one or more second sections 1-22, wherein these spatially distinct sections may be configured/operated differently to achieve desirable switching properties of the power semiconductor device 1. For example, the second section 1-22 may be used to carefully/softly and/or safely switch on the power semiconductor device 1 in both the first section 1-21 and the second section 1-22. After that the first section 1-21 may be turned on fully with a certain time delay and act, due to $W/A_1$ is greater than $W/A_2$, like a "booster" to reduce the collector emitter voltage, that is, the voltage between the first load terminal 11 and the second load terminal 12 during the conductive state. According to some embodiments, turning on the first section 1-21 without sufficient delay could, due to the great extent of $W/A_1$, result in a destruction of the power semiconductor device 1 when turning on against a short circuit between the first and second load terminal 11, 12. By turning on the second section 1-22 before the first section 1-21 it may be ensured that the load terminals 11, 12 are not short-circuited without risking the destruction of the power semiconductor device 1, due to the smaller extent of $W/A_2$.

When the power semiconductor device 1 shall be turned off. For example, the second section(s) 1-22 may be turned off earlier as compared to the first section(s) 1-21, e.g., by applying the first control signal correspondingly earlier than the second control signal, such that the plasma in the semiconductor body 10 is concentrated within the first section(s) 1-21 until also the first section(s) 1-21 is/are turned off (cf. FIG. 8). Such processes may be improved by providing that $W/A_1$ is greater than $W/A_2$ and/or that 80% to 100% of the control electrodes 141, 151 in the second section 1-22 are second control electrodes 151. Further, it may be beneficial to place the first section(s) 1-21 in a central portion of the active region 1-2 and the second sections 1-22 in peripheral portions of the active region 1-2 closer to the border 1-20.

Figure 5:
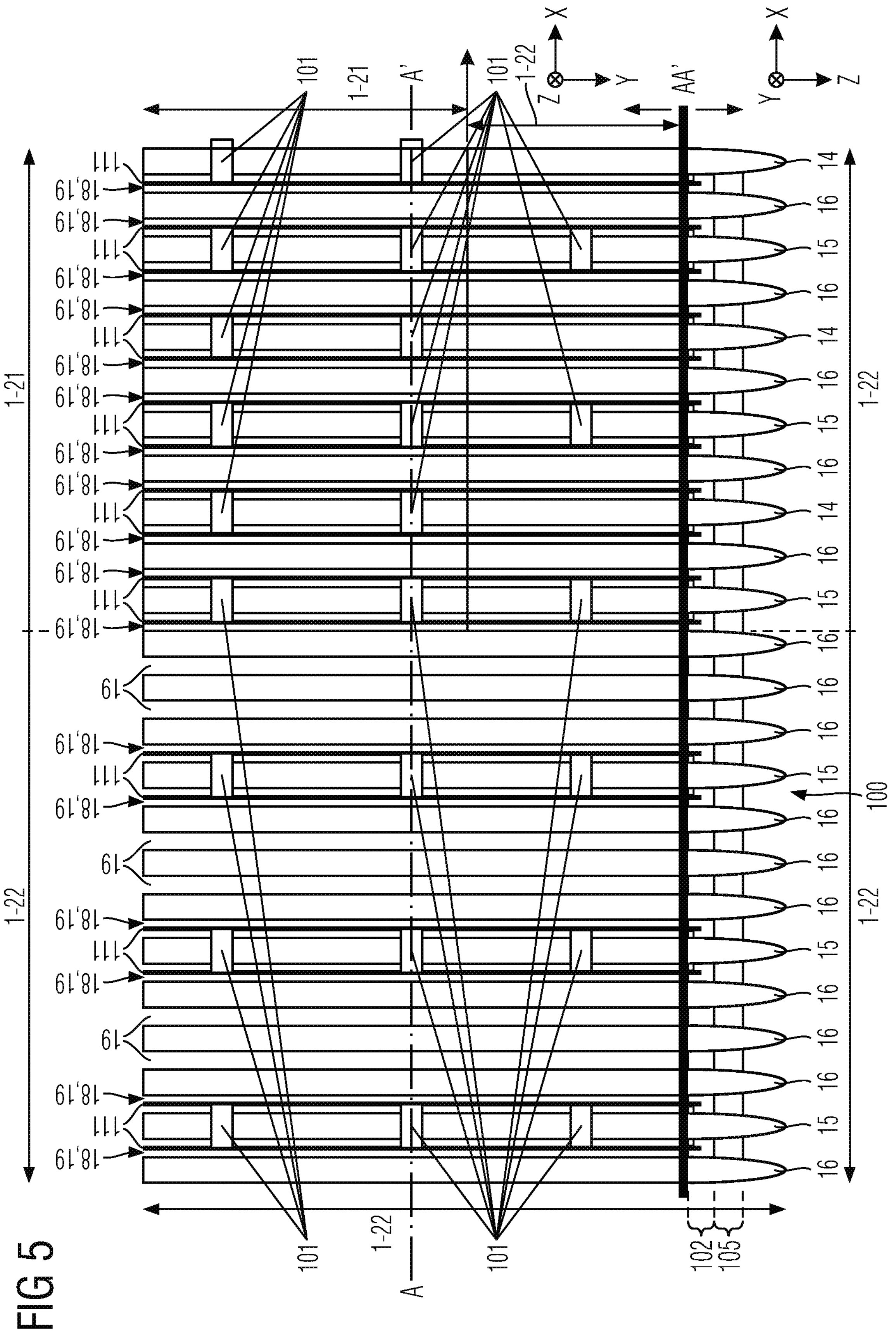
FIG. 5 schematically and exemplarily illustrates a section of a horizontal projection and a corresponding section of a vertical cross-section of a power semiconductor device in accordance with one or more embodiments.
Figure 6:
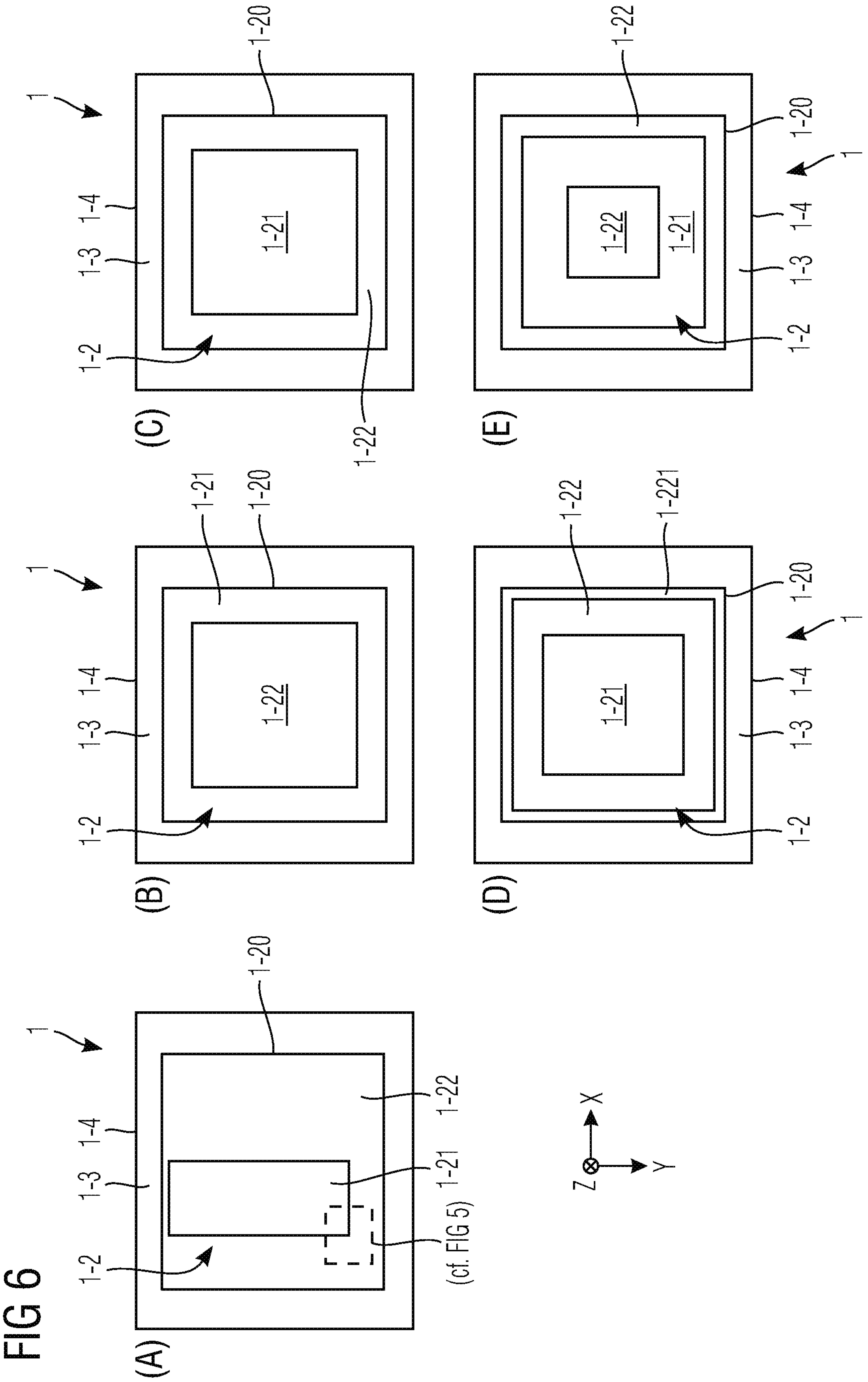
FIG. 6 schematically and exemplarily illustrates a respective section of a horizontal projection of a power semiconductor devices in accordance with at least six embodiments.
Figure 6:
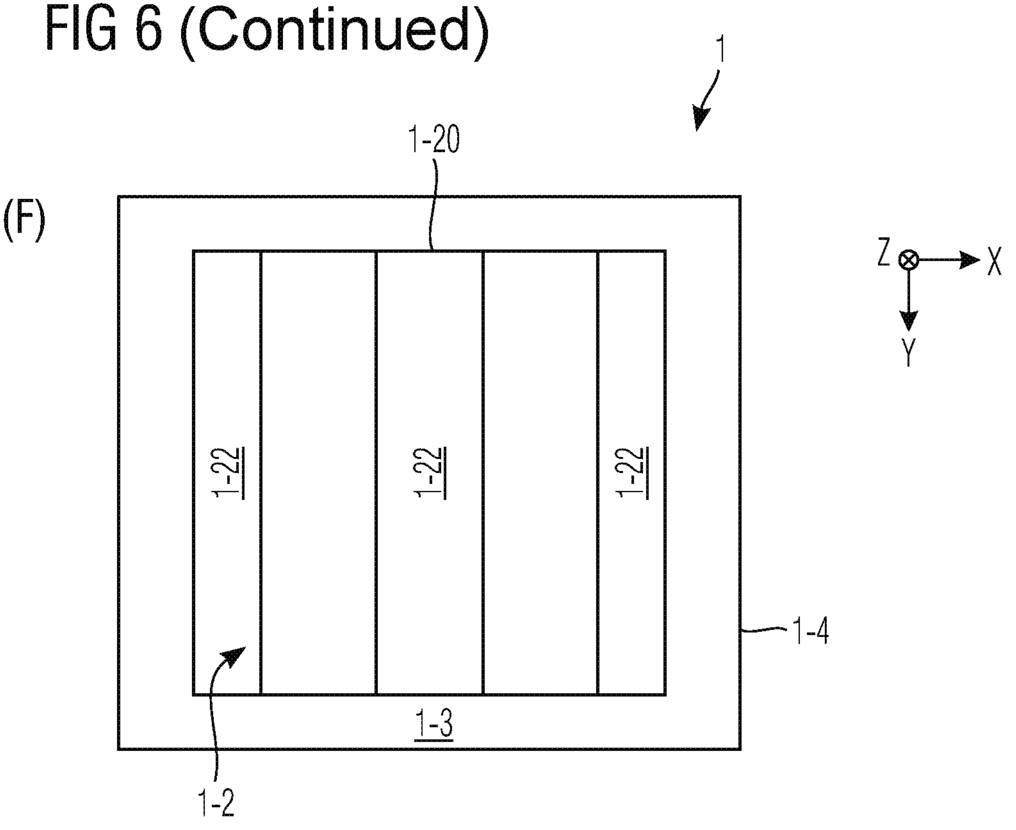
Figure 7:
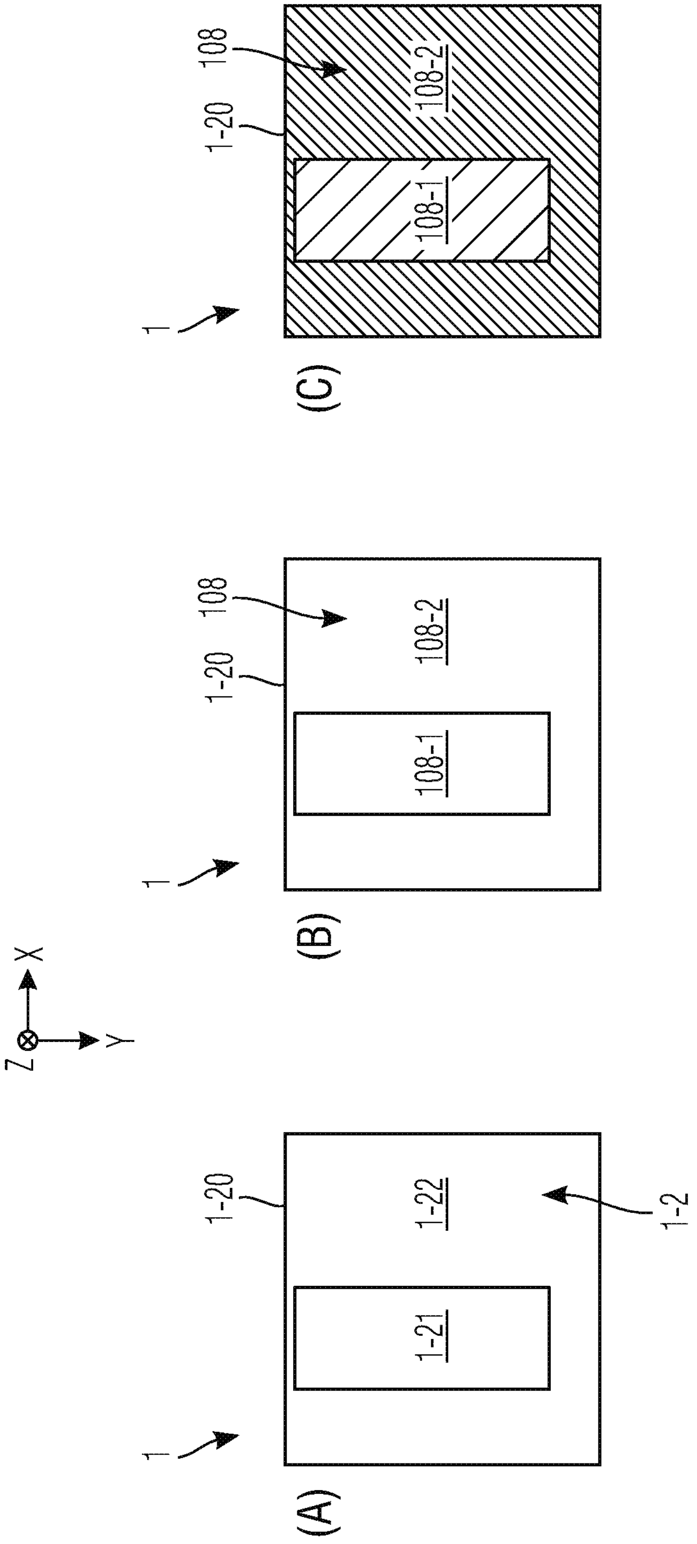
FIG. 7 schematically and exemplarily illustrates a respective section of a vertical cross-section of a power semiconductor devices in accordance with at least three embodiments.
Figure 8:
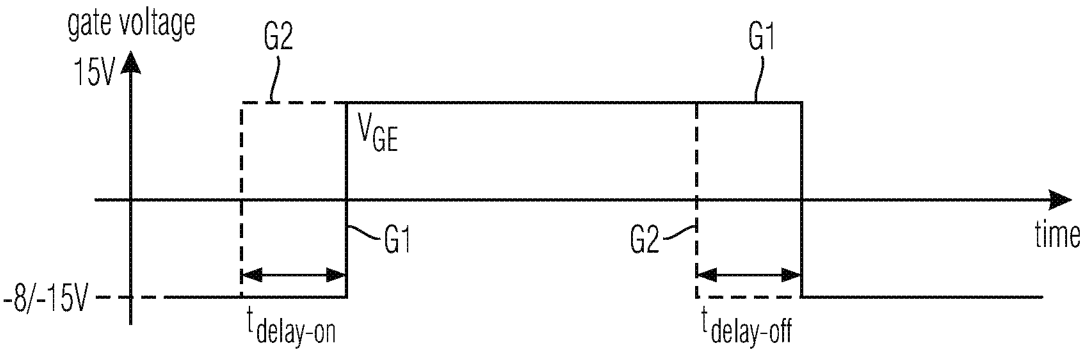
FIG. 8 schematically and exemplary illustrates a method of controlling a power semiconductor device in accordance with one or more embodiments.

The outline of the further description is structured as follows: Based on FIGS. 3 and 4, exemplary configurations of the first section 1-21 and the second section 1-22 will be described. In the following, it will be referred to the first section 1-21 and the second section 1-22, wherein it shall be understood that in case of several first sections 1-21 or, respectively several second sections 1-22 being provided, the corresponding explanations may likewise apply to the further first/second sections 1-21/1-22. Based on FIG. 5, an exemplary transition between the first section 1-21 and the second section 1-22 within the active region 1-2 will be described. FIG. 6 illustrates some exemplary variants related to the positioning and dimensioning of the first section 1-21 and the second section 1-22 within the active region 1-2, FIG. 7 addresses some exemplary features of an emitter region between the drift region 100 and the second load terminal 12 (cf. FIG. 9). FIG. 8 illustrates an exemplary switching process.

According to the embodiments illustrated in FIGS. 3 and 4, the first control electrodes 141 are arranged in first control trenches 14 and insulated from the semiconductor body 10 by a respective first trench insulator 142. Likewise, the second control electrodes 151 are arranged in second control trenches 15 and insulated from the semiconductor body 10 by a respective second trench insulator 152. Further, the semiconductor channel structures are arranged in mesas 18 of the semiconductor body 10, the mesas 18 being laterally confined at least by the control trenches 14, 15 on at least one side. As further illustrated, the power semiconductor device 1 according to these embodiments comprises a plurality of source trenches 16 in both the first section 1-21 and the second section 1-22, each source trench 16 comprising a source electrode 161 electrically connected to the first load terminal 11 and insulated from the semiconductor body 10 by a respective third trench insulator 163. Said trench-mesa pattern, which is not shown in the simplified illustration of FIG. 9, is configured at a front side 110. The mesas 18 including the channel structures are electrically connected to the first load terminal 11, e.g., via first contact plugs 111. For example, in each mesa 18, the contact plug 111 is electrically connected to both the source region 101 and the body region 102. Besides the mesas 18, the trench-mesa pattern may include a second type mesas 19 not comprising a source region 101 and which may be connected to the first load terminal 11 (cf. FIG. 3, variant A) or not (cf. FIG. 3, variant B). However, also the second type of mesa 19 may be equipped with a section of the body region 102, as illustrated.

Optionally, between the body region 102 and the drift region 100, there may be arranged a barrier region 105. Both the barrier region 105 and the drift region 100 are of the first conductivity type, wherein the dopant concentration of the barrier region 105 may be larger as compared to the drift region's dopant concentration.

Briefly also referring to FIG. 9, the drift region 100 extends along the vertical direction Z until interfacing with said emitter region 108 that is electrically connected to the second load terminal 12, in accordance with one or more embodiments. In case of an IGBT or RC-IGBT the emitter region 108 is of the second conductivity type. In case of a MOSFET the emitter region 108 is of the first conductivity type.

The trench-mesa pattern in the second section 1-22 may be variously configured. For example, referring to FIG. 3, variant A, the mesas 18 are arranged adjacent to a respective one of the second control trenches 15, such that the second control electrode 151 included therein may induce, upon receiving the second control signal, the inversion channel in the channel structure formed by the respective source 101 regions and body region 102. As illustrated, between each two adjacent second control trenches 15, there may be arranged one or more source trenches 16, wherein in the example according to FIG. 3, variant A, three source trenches 16 are arranged between each two adjacent second control trenches. The source trenches 16 laterally confine, at least partially, said second type mesas 19. As explained above, the second type mesas 19 do not comprise a source region 101 and which may be connected to the first load terminal 11 (cf. FIG. 3, variant A) or not (cf. FIG. 3, variant B).

The trench-mesa pattern in the first section 1-21 may also be variously configured and deviate from the trench-mesa pattern in the second section 1-22. For example, referring to FIG. 4, variant A, the trench density may be reduced compared to the second section 1-22. Further, at least some of the mesas 18 in the first section 1-21 are controlled based on at least also on the first control electrodes 141 included in the first control trenches 14. For example, in accordance with variant A, each mesa 18 is laterally confined by one of the first control trenches 14 and one of the second control trenches 15. Each mesa 18 may then include two sections of the source region 101, one adjacent to the first control trench 14 and the other one adjacent to the second control trench 15 such that in each mesa 18, two kinds of an inversion channels may be induced. Between each two adjacent mesas 18, there may be arranged source trenches 16 laterally confining (e.g., a total of three) second type mesas 19 between the mesas 18. Now referring to variant B, the trench-mesa pattern formed in the first section 1-21 may also be configured such that each mesa 18 includes only one channel structure that is controlled by either the first control trench 14 or the second control trench 15. The other trench laterally confining the mesa 18 may then be a respective one of the source trenches 16. The configuration according to variant C essentially corresponds to the configuration of variant B, wherein the density of the mesas 18 is reduced by including further source trenches 16 between some adjacent mesas 18 (three instead of only one). The configuration according to variant D is identical to the configuration of variant C, wherein the second type mesas 19 laterally confined by the source trenches 16 are not connected to the first load terminal 11, which is illustrated based on the accordingly missing first contact plugs 111. Finally, in accordance with variant E, pairs of a respective one of the first control trenches 14 and a respective one of the second control trenches 15 are spatially separated by one of the second type mesas 19 not electrically connected to the first load terminal 11. Each mesa 18 including the channel structure is laterally confined by one source trench 16 and either one of the first control trenches 14 or one of the second control trenches 15. Several source trenches 16 laterally confining several second type mesas 19 are arranged between each pair of the first and second control trench 14/15.

With respect to FIG. 6, exemplary dimensions and positions of the first section 1-21 and the second section 1-22 will now be described:

For example, the total area of the second section 1-22 amounts to at least 15%, at least 35%, or at least 45% of the total area of the active region 1-2. Or, the total area of the second section 1-22 is within the range of 50% to 150% of the total area of the first section 1-21. The total area of the first section 1-21 may amount to at least 80% of the remaining total area of the active region 1-2 not occupied by the second section 1-22. The second section 1-22 may surround the first section 1-21, as illustrated in each of variants (A), (C), (D) and (E) of FIG. 6, or vice versa, cf. variant (B). Various designs are possible. For example, the design may be chosen depending on the application. In some cases, a symmetric design (cf. variants (B) to (E) may be appropriate, in other cases, an asymmetric design (cf. variant (A)) may yield advantages. As explained above, more than one second section 1-22 may be provided. For example, the first and second sections 1-21 may be arranged in a stripe configuration according to variant (F), are in a nested configuration according to variant (E). Variant (D) is a modification of variant (C), where the outer second section 1-22 is surrounded by a subsection 1-221, which has a design similar to the second section 1-22, but with modified effective inversion channel width per unit area ratio, e.g., an effective inversion channel width per unit area ratio smaller or great than $W/A_2$. That is, in an embodiment, the second section 1-22 is surrounded by the edge termination region 1-3, and the effective inversion channel width per unit area ratio, $W/A_2$, of the second section 1-22 increases by at least 10% in a direction towards the edge termination region 1-3.

Figure 2:
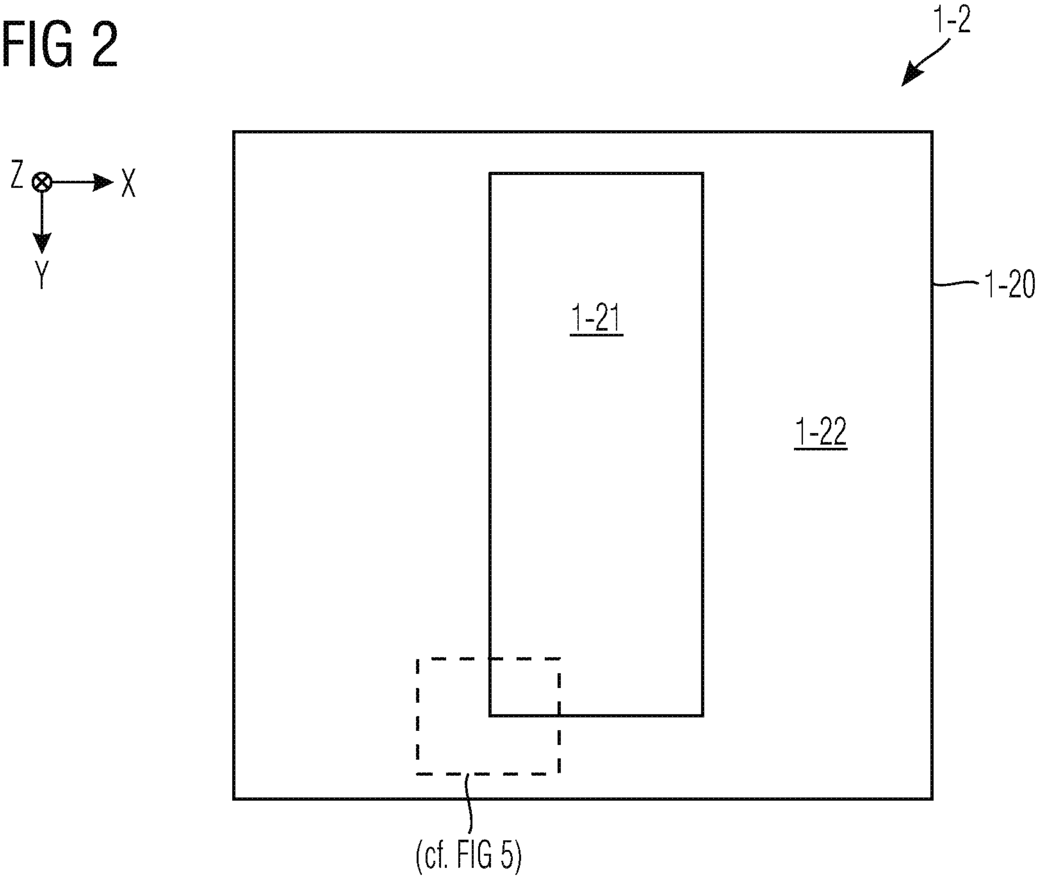
FIG. 2 schematically and exemplarily illustrates a section of a horizontal projection of a power semiconductor device in accordance with one or more embodiments FIG. 3 schematically and exemplarily illustrates a respective second section of a vertical cross-section of an active region of power semiconductor devices in accordance with at least two embodiments.

With respect to FIG. 5, an exemplary transition between the first section 1-21 and the second section 1-22 in the active region 1-2 will now be described. The relevant part of the active region shown in FIG. 5 is also marked in FIG. 2 and FIG. 6 variant (A), cf. the dashed line illustrated in these drawings. FIG. 5 shows, in its upper section, a horizontal projection of this part and, in its lower section, a vertical cross-section corresponding to line AA' indicated in the upper section.

For example, along the first lateral direction X, the transition between the first section 1-21 and the second section 1-22 is implemented by correspondingly changing the trench-mesa-pattern, wherein examples of which were explained with respect to FIGS. 3 and 4.

Here, it is noted that the source region 101 may be spatially structured, e.g., as illustrated in FIG. 5. However, in other embodiments, the source regions 101 have at least roughly the same concentration all across the semiconductor device or more particular in the first section 1-21 as well as the second section 1-22. But, due to the higher effective inversion channel width, the number of implanted atoms per area for forming the source region 101 may be greater in the first section 1-21. Also, the barrier region 105 may be structured, e.g., spatially and/or based on a corresponding varying dopant concentration. The first effective total inversion channel width per unit area ratio, $W/A_1$, and the second effective inversion channel width per unit area ratio, $W/A_2$, may be configured also based on corresponding spatial structure and/or spatial distribution of the dopant concentration of the source region 101 and/or the barrier region 105. For example, the molar mass of the dopants for the source regions 101 per area may be higher in the first section 1-21 than in the second section 1-22, e.g. at least 20% higher, at least 50% higher, at least 100% higher, or at least 200% higher or at least 500% higher. For example, the dopant concentration of the barrier region 105 may the same in the first section 1-21 and in the second section 1-22. In another examples, the dopant concentration of the barrier region 105 may be higher in the first section 1-21 than in the second section 1-22, e.g. at least 20% higher, at least 50% higher, at least 100% higher, or at least 200% higher. This structured barrier region 105 may create or contribute to the increased effective channel width per unit ration in the first section 1-21.

By contrast, in an embodiment, the body region 102 may, according to an embodiment, not be structured but exhibits a substantially constant dopant concentration within the active region 102 along the lateral directions X and Y. Of course, body contact regions (not illustrated) may be locally provided to enhance the electrical contact to the first contact plugs 111 where needed.

Reverting to FIG. 5, due to the spatial structure of the source region 101, the mesa type may vary along the second lateral direction Y, as illustrated. That is, one and the same mesa may, in first sections of its extension along the second lateral direction Y, act as first type mesa 18, where an inversion channel may be induced, and, in second sections of its extension along the second lateral direction Y, act as second type mesa 19, where an inversion channel is not induced. Other second type mesas 19 not electrically connected to the first load terminal 11 may also be provided, as illustrated in FIG. 5 and as has been explained above with respect to FIG. 3 variant (B) and FIG. 4 variant (A), variant (D) and variant (E).

Along the second lateral direction Y, the transition between the first section 1-21 and the second section 1-22 may be implemented according to one or more of several possibilities. For example, a (non-illustrated) cross-trench arrangement may be provided that allows for changing the trench-mesa-pattern at the transition along the second lateral direction Y in the same manner as at the transition along the first lateral direction X. Another option, as illustrated, is to not provide a cross-trench arrangement (or similar spatial structure), but to reflect the change of the section by a corresponding distribution of the source region 101. As can be seen in FIG. 5, several parts of the source region 101 in the first section 1-21 are not correspondingly provided in the second section 1-22; thereby, the effective inversion channel width per unit area ratio in second section 1-22 is reduced compared to the effective inversion channel width per unit area ratio in the first section 1-21 adjacent thereto. This said, it is conceivable that the trench-mesa-pattern of the second section 1-22 may vary slightly along the first direction X, depending on how the transition between the first section 1-21 and the second section 1-22 along the second lateral direction Y is implemented. In the illustrated example, the trench-mesa-pattern of the part of the second section 1-22 "below" the first section 1-21 is identical to the corresponds to trench-mesa-pattern of the first section 1-21 (but still exhibiting a lower effective inversion channel width per unit area ratio due to the fewer source regions 101). Hence, in such parts of the second section 1-22, the second section 1-22 may for example include first control trenches 14, wherein in the remaining parts of the second section 1-22, there are no first trenches 14, in accordance with an embodiment.

The above described features may be combined with a correspondingly configured emitter region 108 at the second load terminal 12 (cf. FIG. 9). Further referring to FIG. 7, there is provided in the semiconductor body 10 and electrically connected to the second load terminal 12, an emitter region 108. The emitter region 108 extends in both the first section 1-21 and the second section 1-22 (cf. FIG. 7, variant (A), corresponding to FIG. 6, variant (A)), wherein an average dopant concentration of the emitter region part 108-2 extending into the second section 1-22 is greater than an average dopant concentration of the emitter region part 108-1 extending into the first section 1-21. The emitter region may be of the second conductivity type The emitter region parts 108-1 and 108-2 may be configured with a respective laterally homogeneous dopant concentration (cf. FIG. 7, variant (B)) or may each be laterally structured (cf. FIG. 7, variant (C)), e.g., based on stripe configuration with alternating highly doped and lower doped stripes. Irrespective of whether or not and how the emitter region parts 108-1 and 108-2 are structured, difference of the average active dopant concentrations may be a factor within the range of 1.5 to 20, i.e., the average dopant concentration of the emitter region part 108-2 may be 2.5 to 10 greater than the average dopant concentration of the emitter region part 108-1. In some embodiments, there may be two or more higher doped emitter region parts 108-2 surrounded by a lower doped emitter region 108-1. This structure may, for example, be arranged opposite to the first section 1-21.

Referring to FIG. 8, according to a further embodiment, a method of controlling a power semiconductor device exhibiting an IGBT-configuration is presented.

Said power semiconductor device may be configured in accordance with an embodiment presented above with respect to FIGS. 1-7 and FIG. 9. For example, the power semiconductor device comprises: a semiconductor body coupled to a first load terminal and a second load terminal; an active region with a first section and a second section, both configured to conduct a load current between the first load terminal and the second load terminal; electrically isolated from the first load terminal and the second load terminal, a plurality of first control electrodes in the first section and a plurality of second control electrodes in both the first section and the second section; a plurality of semiconductor channel structures in the semiconductor body extending in both the first section and the second section, each of the plurality of channel structures being associated to at least one of the first and second control electrodes, wherein the respective at least one of the first and second control electrodes is configured to induce an inversion channel for load current conduction in the associated semiconductor channel structure, wherein 80% to 100% of the control electrodes in the second section are second control electrodes.

The method comprises controlling a switching process by subjecting the first control electrodes to a first control signal G1 and subjecting the second control electrodes to a second control signal G2, wherein the first control signal is provided with a time delay with respect to the second control signal.

In an embodiment, both the first control signal G1 and the second control signal G2 exhibit one of only two values, e.g., an OFF value (of, e.g., −8 V or −15 V) and an ON value (of, e.g., 15 V). That is, neither the first control signal G1 or the second control signal G2 need to be provided with an intermediate value (of, e.g., 0 V).

To turn the first section 1-21, the first control signal G1 is changed from its OFF value to its ON value. Likewise, to turn the second section 1-22, the second control signal G2 is changed from its OFF value to its ON value. The OFF values of the first and second control signals G1, G2 may be identical to each other, and also the ON values of the first and second control signals G1, G2 may be identical to each other. When exhibiting the ON value, the respective control signal induces inversion channels in the channel structures, thereby allowing flow of a load current if the power semiconductor device 1 is forwardly biased. When exhibiting the OFF value, the respective control signal breaks down the inversion channels, thereby inducing a blocking state preventing flow of the load current even if the power semiconductor device 1 is forwardly biased.

As illustrated in FIG. 8, the two sections 1-21 and 1-22 may be independently controlled based on the first and second control signals G1 and G2, e.g., by performing switching processes with a phase shift/time delay. For example, the second section 1-22 is switched ON and OFF before the first section 1-21. The respective time delay with which the first section 1-21 "follows", $t_{delay\_on}$ and $t_{delay\_off}$, can be within the range of some 100 ns, e.g., both at least 1 μs, wherein $t_{delay\_on}$ and $t_{delay\_off}$ may differ from each other.

Based on such time delay(s), the G2 is turned on first, to enable a turn-on of the semiconductor device 1 almost evenly distributed over the entire active area 1-2. During $t_{delay\_on}$ the short-circuit detection circuit detects if there is a short-circuit present or not. Only if no short-circuit is present, the G1 is turned on providing more channel width to the device. That leads to a reduction of the on-state voltage drop. Before the turn-off is triggered by G1, G2 is turned-off. That reduces the charge carrier plasma in the entire chip. This effect is more pronounced in 1-22 where no or only little charge carrier plasma is injected by the channel regions at 14. That reduces the overall turn-off losses.

In accordance with the embodiments presented above, a power semiconductor device with hetero IGBT configurations may be provided in a single semiconductor chip. The different IGBT configurations may be implemented in distinct sections of the active area and individually controlled based on independent control signals. Using colloquial language, two "different IGBT" may be provided in one chip and individually controlled. This yields a high degree of flexibility for optimizing device characteristics, such as switching behavior and heat distribution.

As explained above, the difference between the first section(s) 1-21 and the second section(s) 1-22 may be in that:

a. the first section 1-21 exhibits a first effective total inversion channel width per unit area ratio, $W/A_1$ and the second section 1-22 exhibits a second effective inversion channel width per unit area ratio, $W/A_2$, wherein $W/A_1$ is greater than $W/A_2$; and/or in that b. 80% to 100% of the control electrodes 141/151 in the second section 1-22 are second control electrodes 151 and that the first control signal G1 is provided with a time delay with respect to the second control signal G2.

As explained above, the inversions channels may be induced where the device a exhibits a correspondingly configured channel structure that may be controlled by one of the first control electrodes 141 or one of the second control electrodes 151. The spatial configuration of the respectively relevant channel structure, in particular the lateral dimensions of the source region 101 and the body region 102, as well as presence and configuration of other parts that may influence the inversions channels, such as the barrier region 105, define, in their entirety, the first effective total inversion channel width per unit area ratio, $W/A_1$, and the second effective inversion channel width per unit area ratio, $W/A_2$, wherein $W/A_1$ is greater than $W/A_2$. In the above, many options have been described how such difference between $W/A_1$ and $W/A_2$ may be achieved, which include:

a1) A correspondingly structured source region 101, e.g., with "less" source region area in the second section 1-22 as compared to the first section 1-21, cf., e.g., explanations with respect to FIG. 5, or with "larger" source regions 101 in the first section 1-21, cf. FIG. 4 variant (A).

a2) A correspondingly structured barrier region 105.

a3) A source trench density (with respect to the area) in the second section 1-22 is greater than a source trench density in the first section 1-21, cf. source trenches 16 in FIG. 3 vs. FIG. 4.

a4) A second type mesa density (with respect to the area) in the second section 1-22 is greater than a source trench density in the first section 1-21, cf. second type mesas 19 in FIG. 3 vs. FIG. 4.

It shall be understood that the four options above are only exemplary and that these may be applied separately or in combination with each other. Of course, these four options are only exemplary and do not exclude other ways of achieving the difference between $W/A_1$ and $W/A_2$.

In addition to the first section(s) 1-21 and second section(s) 1-22, distinct diode sections may be provided in the active region 1-2, e.g., so as to provide the device 1 with improved reverse conductivity, RC, properties. Depending on the application, such distinct diode sections may form at least 10 to 40% of the active region 1-2.

Also presented herein are embodiments of methods of producing a power semiconductor device.

According to an embodiment, a method of producing a power semiconductor device exhibiting an IGBT-configuration or a MOSFET-configuration comprises the forming the following components: a semiconductor body coupled to a first load terminal and a second load terminal; an active region with a first section and a second section, both configured to conduct a load current between the first load terminal and the second load terminal; electrically isolated from the first load terminal and the second load terminal, a plurality of first control electrodes in the first section and a plurality of second control electrodes in both the first section and the second section; and a plurality of semiconductor channel structures in the semiconductor body extending in both the first section and the second section, each of the plurality of channel structures being associated to at least one of the first and second control electrodes, wherein the respective at least one of the first and second control electrodes is configured to induce an inversion channel for load current conduction in the associated semiconductor channel structure. The first section exhibits a first effective total inversion channel width per unit area ratio, $W/A_1$, and the second section exhibits a second effective inversion channel width per unit area ratio, $W/A_2$, wherein $W/A_1$ is greater than $W/A_2$.

According to another embodiment, a method of producing a power semiconductor device exhibiting an IGBT-configuration or a MOSFET-configuration comprises the forming the following components: a semiconductor body coupled to a first load terminal and a second load terminal; an active region with a first section and a second section, both configured to conduct a load current between the first load terminal and the second load terminal; electrically isolated from the first load terminal and the second load terminal, a plurality of first control electrodes in the first section and a plurality of second control electrodes in both the first section and the second section; a plurality of semiconductor channel structures in the semiconductor body extending in both the first section and the second section, each of the plurality of channel structures being associated to at least one of the first and second control electrodes, wherein the respective at least one of the first and second control electrodes is configured to induce an inversion channel for load current conduction in the associated semiconductor channel structure, wherein 80% to 100% of the control electrodes in the second section are second control electrodes; a driver unit configured to control a switching process by subjecting the first control electrodes to a first control signal and subjecting the second control electrodes to a second control signal. The first control signal is provided with a time delay with respect to the second control signal.

Further embodiments of the methods presented above correspond to the embodiments of the power semiconductor device presented above. In so far, it is referred to the aforesaid.

In the above, embodiments pertaining to power semiconductor device, such as MOSFETs, IGBTs, RC IGBTs and derivatives thereof, and corresponding processing and control methods were explained. For example, these power semiconductor devices are based on silicon (Si). Accordingly, a monocrystalline semiconductor region or layer, e.g., the semiconductor body and its regions/zones, e.g., regions etc. can be a monocrystalline Si-region or Si-layer. In other embodiments, polycrystalline or amorphous silicon may be employed.

It should, however, be understood that the semiconductor body and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:

a semiconductor body coupled to a first load terminal and a second load terminal;

an active region with a first section and a second section, both configured to conduct a load current between the first load terminal and the second load terminal;

electrically isolated from the first load terminal and the second load terminal, a plurality of first control electrodes in the first section and a plurality of second control electrodes in both the first section and the second section, wherein the first control electrodes are insulated from the second control electrodes;

a plurality of semiconductor channel structures in the semiconductor body extending in both the first section and the second section, each of the plurality of channel structures being associated to at least one of the first and second control electrodes, wherein the respective at least one of the first and second control electrodes is configured to induce an inversion channel for load current conduction in the associated semiconductor channel structure, wherein 80% to 100% of the control electrodes in the second section are second control electrodes; and a driver unit configured to control a switching process by subjecting the first control electrodes to a first control signal and subjecting the second control electrodes to a second control signal, wherein the first control signal is provided with a time delay with respect to the second control signal.

2. The power semiconductor device of claim 1, wherein the first section exhibits a first effective total inversion channel width per unit area ratio, $W/A_1$ and the second section exhibits a second effective inversion channel width per unit area ratio, $W/A_2$, and wherein $W/A_1$ is greater than $W/A_2$.

3. The power semiconductor device of claim 1, wherein the number of control electrodes per unit area in the first section is greater than the number of control electrodes per unit area in the second section.

4. The power semiconductor device of claim 1, wherein the first control electrodes are electrically isolated from the second control electrodes.

5. The power semiconductor device of claim 1, wherein the total area of the second section amounts to at least 20% of the total area of the active region.

6. The power semiconductor device of claim 5, wherein the total area of the first section amounts to at least 80% of the remaining total area of the active region not occupied by the second section.

7. The power semiconductor device of claim 1, wherein the second section surrounds the first section.

8. The power semiconductor device of claim 1, wherein the second section is surrounded by an edge termination region, and wherein the effective inversion channel width per unit area ratio of the second section increases by at least 10% in a direction towards the edge termination region.

9. The power semiconductor device of claim 1, further comprising, in the semiconductor body and electrically connected to the second load terminal, an emitter region of the second conductivity type, the emitter region extending in both the first section and the second section, wherein an average dopant concentration of the emitter region part extending into the second section is greater than an average dopant concentration of the emitter region part extending into the first.

10. The power semiconductor device of claim 1, wherein:

the first control electrodes are arranged in first control trenches and insulated from the semiconductor body by a respective first trench insulator;

the second control electrodes are arranged in second control trenches and insulated from the semiconductor body by a respective second trench insulator; and the semiconductor channel structures are arranged in mesas of the semiconductor body, the mesas being laterally confined at least by the control trenches on at least one side.

11. The power semiconductor device of claim 10, further comprising a plurality of source trenches in both the first section and the second section, each source trench comprising a source electrode electrically connected to the first load terminal.

12. The power semiconductor device of claim 11, wherein an average number of source trenches arranged between adjacent semiconductor channel structures in the first section is smaller than an average number of source trenches arranged between adjacent semiconductor channel structures in the second section.

13. The power semiconductor device of claim 11, wherein in the first section, along a distance between a semiconductor channel structure controlled by one of the first control electrodes and an adjacent semiconductor channel structure controlled by one of the second control electrodes, there is arranged one or none of the source trenches.

14. The power semiconductor device of claim 1, wherein the semiconductor body is formed in a single semiconductor chip.

15. The power semiconductor device of claim 1, wherein the time delay amounts to at least 1 μs.

16. A method of controlling a power semiconductor device, wherein the power semiconductor device comprises: a semiconductor body coupled to a first load terminal and a second load terminal; an active region with a first section and a second section, both configured to conduct a load current between the first load terminal and the second load terminal; electrically isolated from the first load terminal and the second load terminal, a plurality of first control electrodes in the first section and a plurality of second control electrodes in both the first section and the second section, wherein the first control electrodes are insulated from the second control electrodes; and a plurality of semiconductor channel structures in the semiconductor body extending in both the first section and the second section, each of the plurality of channel structures being associated to at least one of the first and second control electrodes, wherein the respective at least one of the first and second control electrodes is configured to induce an inversion channel for load current conduction in the associated semiconductor channel structure, wherein 80% to 100% of the control electrodes in the second section are second control electrodes, the method comprising:

controlling a switching process by subjecting the first control electrodes to a first control signal; and subjecting the second control electrodes to a second control signal, wherein the first control signal is provided with a time delay with respect to the second control signal.

* * * * *